United States Patent
Asano

(10) Patent No.: US 7,184,913 B2
(45) Date of Patent: Feb. 27, 2007

(54) TESTING SYSTEM, A COMPUTER IMPLEMENTED TESTING METHOD AND A METHOD FOR MANUFACTURING ELECTRONIC DEVICES

(75) Inventor: Masafumi Asano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 11/377,250

(22) Filed: Mar. 17, 2006

(65) Prior Publication Data

US 2006/0161385 A1    Jul. 20, 2006

Related U.S. Application Data

(62) Division of application No. 10/947,259, filed on Sep. 23, 2004, now Pat. No. 7,047,147.

(30) Foreign Application Priority Data

Sep. 24, 2003   (JP) ............................. 2003-332214

(51) Int. Cl.
*G06F 19/00*   (2006.01)

(52) U.S. Cl. ....................................... 702/108; 438/17

(58) Field of Classification Search ................ 702/108, 702/182–185, 188; 438/17
See application file for complete search history.

(56) References Cited

U.S. PATENT DOCUMENTS

| 6,055,463 A | 4/2000 | Cheong et al. |
|---|---|---|
| 6,456,736 B1 | 9/2002 | Su et al. |
| 6,798,529 B2 * | 9/2004 | Saka et al. ................ 356/630 |

* cited by examiner

*Primary Examiner*—Edward Raymond
(74) *Attorney, Agent, or Firm*—Finnegan, Henderson, Farabow, Garrett & Dunner, L.L.P.

(57) ABSTRACT

A testing system includes a testing device configured to test product characteristics of a first sample by sampling the first sample from a population; a main storage device configured to store analysis information and testing information, the testing information includes a confidence interval tolerance of the first sample; an analysis module configured to analyze at least one of statistical data and a confidence interval of a mean value of the population, based on the analysis information; and a calculation module configured to calculate a first sampling number of the first sample, based on results of the analysis module.

4 Claims, 12 Drawing Sheets

TESTING SYSTEM, A COMPUTER IMPLEMENTED TESTING METHOD AND A METHOD FOR MANUFACTURING ELECTRONIC DEVICES

CROSS REFERENCE TO RELATED APPLICATIONS

This is a divisional of application Ser. No. 10/947,259, filed Sep. 23, 2004, which is incorporated herein by reference now U.S. Pat No. 7,047,147.

This application is based upon and claims the benefit of priority from the prior Japanese Patent Applications No. P2003-332214, filed on Sep. 24, 2003; the entire contents of which are incorporated herein by reference.

BACKGROUND OF THE INVENTION

1. Field of the Invention

The present invention relates to a testing system, a computer implemented testing method, and a method for manufacturing electronic devices, which are suitable for manufacturing a semiconductor device.

2. Description of the Related Art

There are a variety of processes such as deposition, lithography and etching in a manufacturing process of a semiconductor device. After completion of each process, a test to determine whether or not the semiconductor device has been desirably processed is performed. As examples of such tests, there are: a film-thickness measurement, which is performed after the deposition process, such as CVD and sputtering, an overlay error test, which is performed after the lithography, a critical dimensional measurement, which is performed after the lithography and the etching.

Needless to say, data accuracy is required in such tests. Specifically, it is most important to obtain mean values, variations and the like of film thickness, dimensions and the like. However, complete test of all chip areas in a manufacturing process is actually impossible, and usually, a sample testing is performed by properly sampling only some chip areas or wafers. For example, In normal lithography, a lot composed of approximately 25 wafers is defined as one processing unit. In an overlay error test of such lots, at most approximately five wafers are sampled from each lot, approximately 10 chip areas per wafer are selected, of which overlay errors are then measured, and values obtained by the measurement are taken as a mean value of the lot. The mean value obtained by such a sample testing is a "sample mean" referred to in statistics, and is an estimate of a mean (population mean) of the whole of the lot (population).

Now, it is assumed that the overlay errors in the lot follow a normal distribution $N(\mu, \sigma^2)$ (where $\mu$ is the population mean, and $\sigma$ is a known standard deviation). When an idea of the interval estimation is used in a case of estimating the population mean $\mu$ from a sample mean x obtained from n samples, a range where the population mean $\mu$ exists in a probability of 95% (95% confidence interval) is represented by the following Equation (1):

$$x - 1.96\sigma/(n)^{1/2} < \mu < x + 1.96\sigma/(n)^{1/2} \quad (1)$$

However, in the case of using Equation (1), the range of the confidence interval changes depending on the standard deviation $\sigma$ and the number n of samples in the lot, and accordingly, estimation accuracy for the population mean $\mu$ varies. Particularly, when the standard deviation $\sigma$ is large and the number n of samples is small, the estimation accuracy for the population mean $\mu$ lowers, thus adversely affecting the full comprehension and control of process capabilities. Meanwhile, in the case of performing the test for the constant number n of samples, the confidence interval of data becomes varied depending on the standard deviation $\sigma$ of each lot. Therefore, the obtainment of the confidence interval by use of Equation (1) is disadvantageous for highly accurate process control.

SUMMARY OF THE INVENTION

An aspect of the present invention inheres in a testing system encompassing a testing device configured to test product characteristics of a first sample by sampling the first sample from a population; a main storage device configured to store analysis information to analyze tested results by the testing device and testing information employed by the testing device to test the first sample, the testing information includes a confidence interval tolerance of the first sample; an analysis module configured to analyze at least one of statistical data included in the tested results and a confidence interval of a mean value of the population, based on the analysis information; and a calculation module configured to calculate a first sampling number of the first sample, based on results of the analysis module.

Another aspect of the present invention inheres in a computer implemented testing method encompassing testing product characteristics of a first sample by sampling the first sample from a population; storing analysis information to analyze tested results and testing information to test the first sample in a main storage device, the testing information includes a confidence interval tolerance of the first sample; analyzing at least one of statistical data included in tested results and a confidence interval of a mean value of the population, based on the analysis information; and calculating a first sampling number of the first sample, based on results of analyzing.

Still another aspect of the present invention inheres in a method for manufacturing electronic devices encompassing a plurality of fabrication processes of the electronic devices; a plurality of in-line testing processes of the corresponding fabrication processes, each of the in-line testing processes including: storing testing information and analysis information in a main storage device; sampling one of the electronic devices as a first sample from a lot of the electronic devices, which have been treated though the corresponding one of the fabrication processes; testing product characteristics of the first sample by sampling the first sample from a population; analyzing at least one of statistical data included in the tested results and a confidence interval of a mean value of the population, based on the analysis information; and calculating a first sampling number of the first sample, based on results of analyzing.

DETAILED DESCRIPTION OF THE INVENTION

Figure 1:
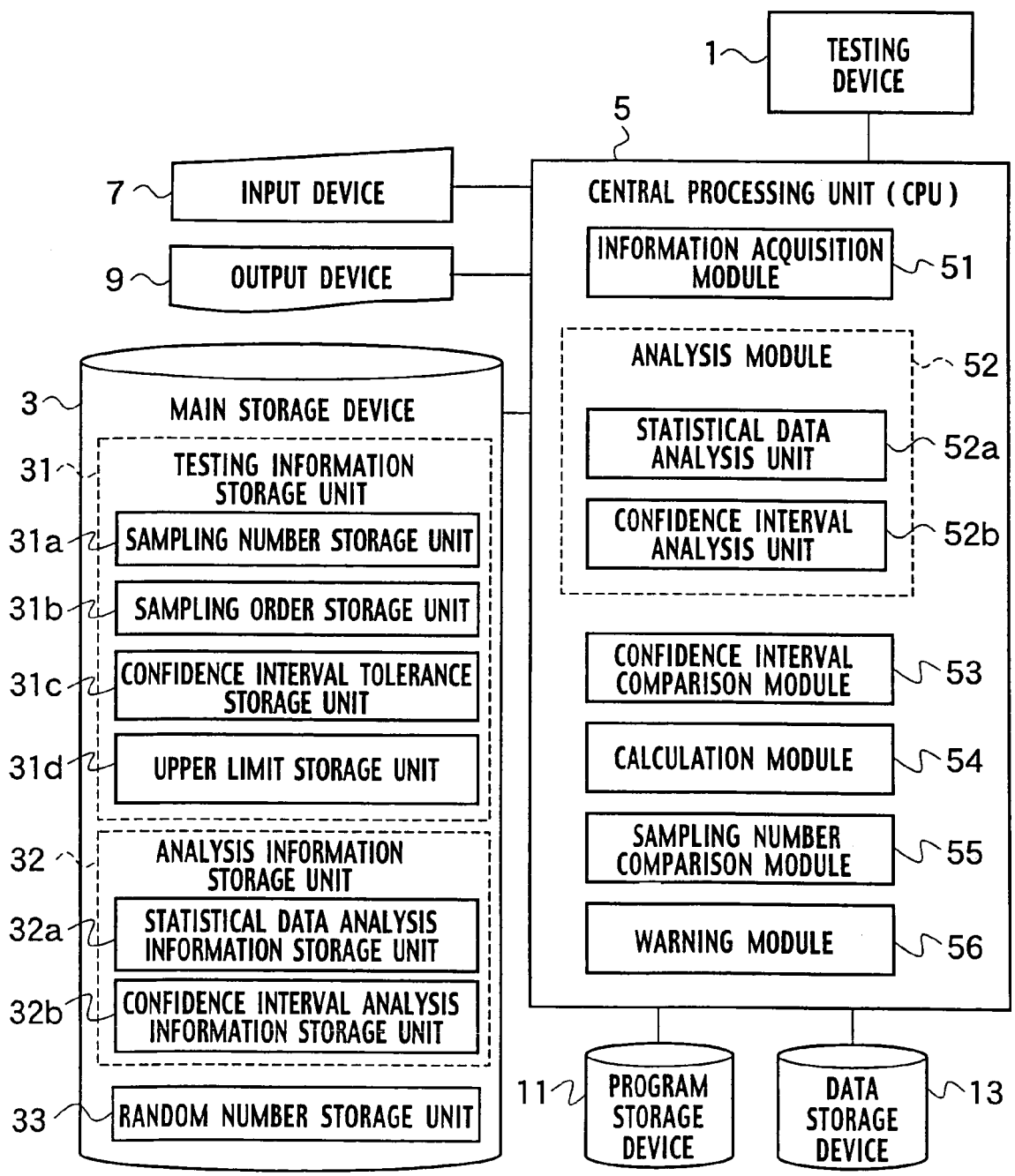
FIG. 1 is a block diagram showing a testing system according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. In the following descriptions, numerous details are set forth such as specific signal values, etc. to provide a thorough understanding of the present invention. However, it will be obvious to those skilled in the art that the present invention may be practiced without such specific details.

First Embodiment

As shown in FIG. 1, a testing system according to a first embodiment of the present invention includes a testing device 1, a main storage device 3, a central processing unit (CPU) 5, an input device 7, an output device 9, a program storage device 11, and a data storage device 13. The main storage device 3 includes a testing information storage unit 31, an analysis information storage unit 32, and a random number storage unit 33. The CPU 5 includes an information acquisition module 51, an analysis module 52, a confidence interval comparison module 53, a calculation module 54, a sampling number comparison module 55, and a warning module 56.

Figure 2:
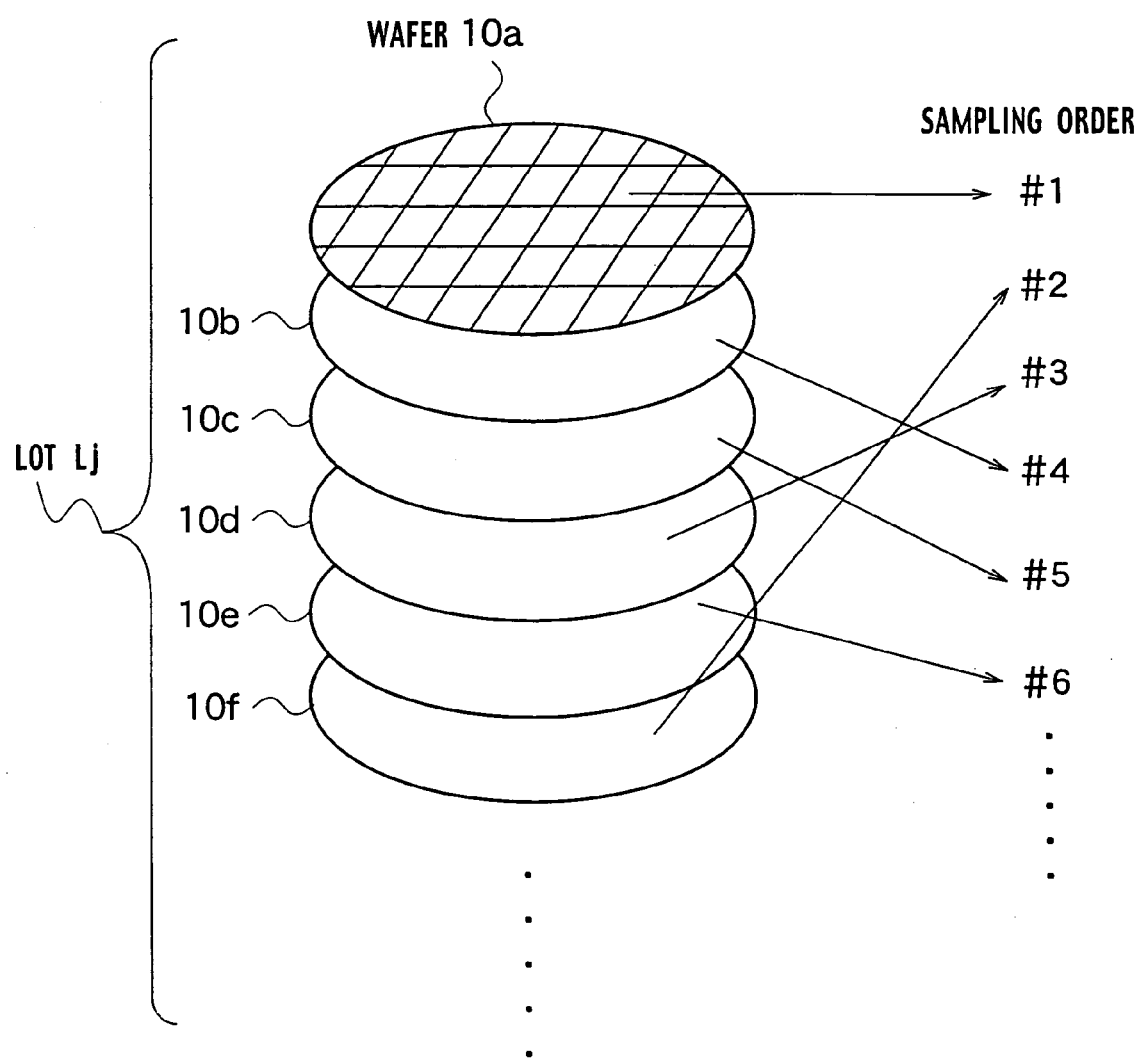
FIG. 2 is a schematic diagram showing an example of a lot including wafers tested by the testing device in FIG. 1.
Figure 3:
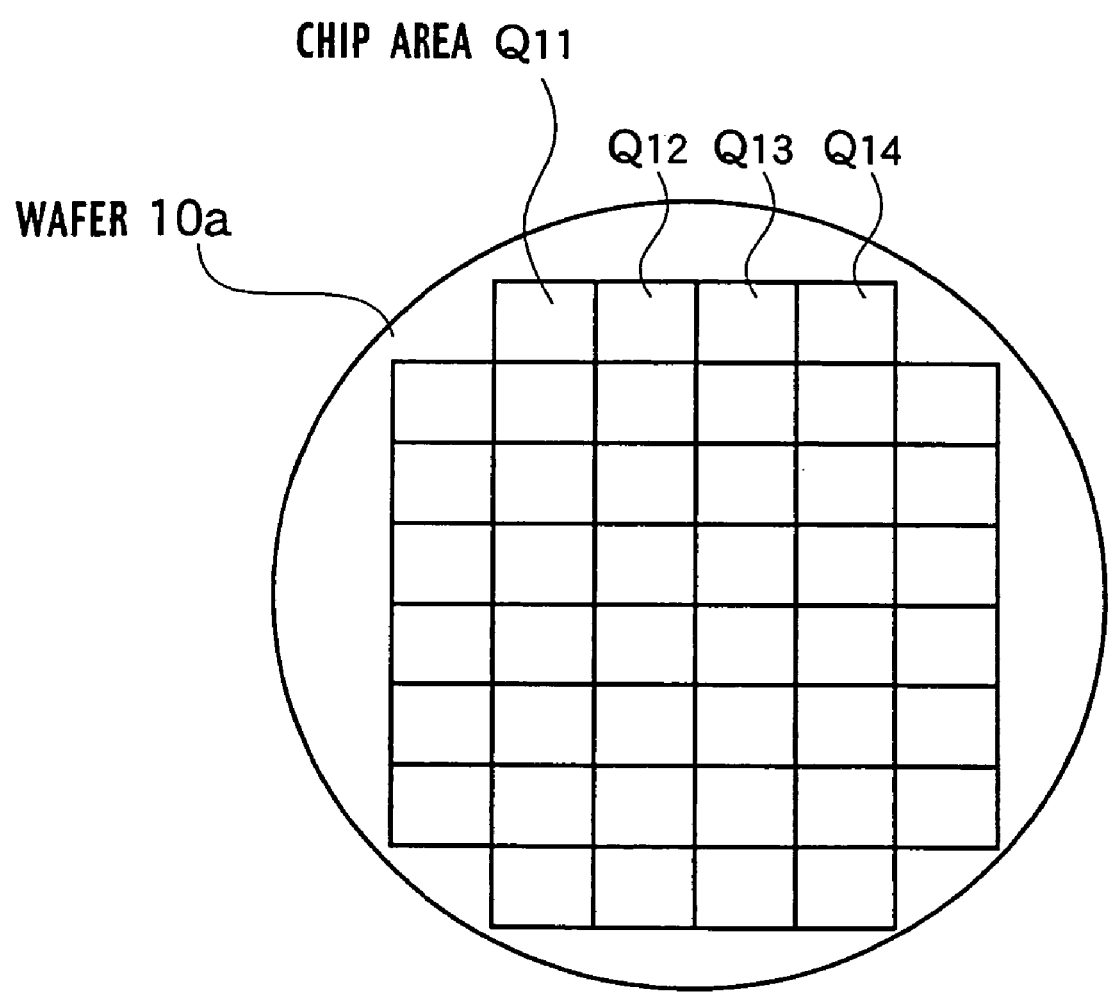
FIG. 3 is an enlarged view showing the wafer in FIG. 2.

The testing device 1 selectively samples wafers (samples) $10a$, $10b$, $10c$, $10d$, $10e$, $10f$..., from a lot $L_j$ (population) as shown in FIG. 2, and tests product characteristics of the sampled wafers $10a$, $10b$, $10c$, $10d$, $10e$, $10f$.... As shown in FIG. 3, on a surface of the wafer $10a$, a plurality of chip areas $Q_{11}$, $Q_{12}$, $Q_{13}$, $Q_{14}$... are individually formed. In a similar way, a plurality of chip areas are formed on each of the wafers $10b$, $10c$, $10d$, $10e$, $10f$.... For each of the chip areas $Q_{11}$, $Q_{12}$, $Q_{13}$, $Q_{14}$..., the testing device 1 shown in FIG. 1 measures an overlay error between patterns after lithography, circuit patterns of a semiconductor device, which include those of a transistor, wiring and a contact hole, dimensions such as film thickness and trench depth, electric characteristics, and the like. A specific configuration of the testing device 1 is not particularly limited, for example, an optical overlay monitor tool, a scanning electron microscope, a transmission electron microscope, a focused ion beam device, an atomic force microscope, an electric characteristics measurement device and the like may be usable.

The testing information storage unit 31 shown in FIG. 1 selectively samples the wafers $10a$, $10b$, $10c$, $10d$, $10e$, $10f$... shown in FIG. 2 by the testing device 1, and stores testing information to test the product characteristics thereof. The testing information storage unit 31 includes a sampling number storage unit $31a$, a sampling order storage unit $31b$, a confidence interval tolerance storage unit $31c$, and an upper limit storage unit $31d$. The sampling number storage unit $31a$ stores a sampling number a of the wafers $10a$, $10b$, $10c$, $10d$, $10e$, $10f$..., which is input from the input device 7. The sampling order storage unit $31b$ stores a sampling order for preferentially sampling the wafers $10a$, $10b$, $10c$, $10d$, $10e$, $10f$... input from the input device 7. The confidence interval tolerance storage unit $31c$ stores a tolerance (95% confidence interval tolerances $c_0$ will be described later) of an estimation accuracy of a confidence interval input from the input device 7. The upper limit storage unit $31d$ stores an upper limit of the sampling number of the wafers $10a$, $10b$, $10c$, $10d$, $10e$, $10f$..., the upper limit being input from the input device 7.

The analysis information storage unit 32 stores analysis information for analyzing testing results of the product characteristics or the like of the chip area tested by the testing device 1. The analysis information storage unit 32 includes a statistical data analysis information storage unit $32a$ and a confidence interval analysis information storage unit $32b$. The statistical data analysis information storage unit $32a$ stores an analytic equation for analyzing the population mean μ and a sample standard deviation s of the lot $L_j$, which serve as statistical data, based on testing results of the lot $L_j$ tested by the testing device 1. The confidence interval analysis information storage unit $32b$ stores an analytic equation for obtaining a 95% confidence interval c for analyzing "a 95% confidence interval" of the population mean μ, for example, from n samples of the lot $L_j$ (j=1 to m), the analytic equation represented as:

$$c = ts/n^{1/2} \quad (2)$$

or $$c = 1.96\sigma/n^{1/2} \quad (3)$$

The Equation (2) is usable when the standard deviation σ of the lot $L_j$ tested by the testing device 1 is unknown before the test. "t" is derived from a T-distribution. "s" is a sample standard deviation. Meanwhile, Equation (3) is usable when the standard deviation σ of a lot to be tested is already known before the test. Moreover, "the 95% confidence interval" described above refers to "a range where the population mean μ of the lot exists in a probability of 95%," and when the sample mean is x, a relationship between the sample mean x, the 95% confidence interval c and the population mean $\mu$ is represented as:

$$x - c \leq \mu \leq x + c \qquad (4)$$

Figure 5:
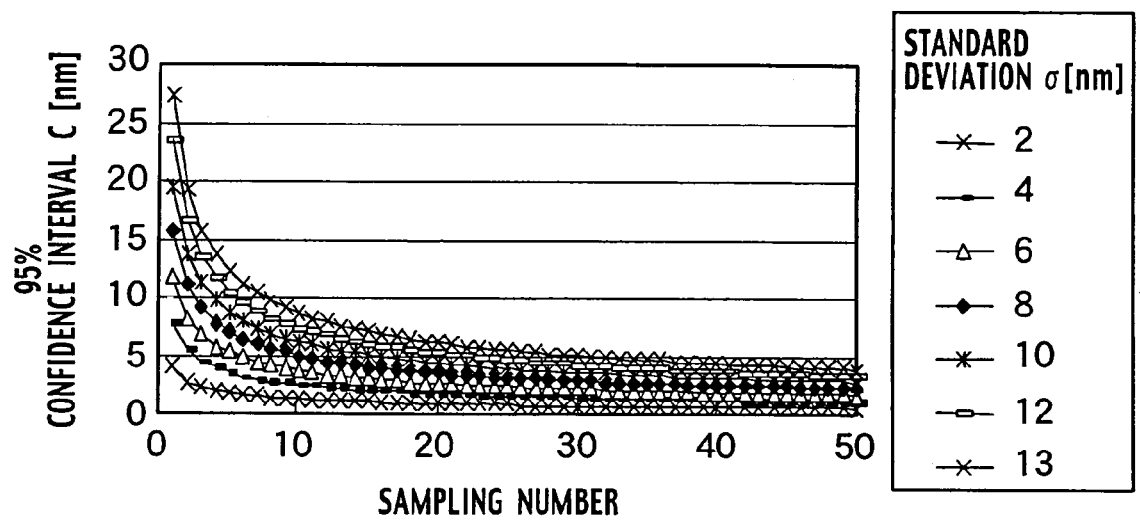
FIG. 5 is a schematic diagram showing a general conception of the relationships between the 95% confidence intervals c (one side) and the numbers n of samples in the standard deviations $\sigma$ of the respective lots.

As specific examples of sample tests using the Equation (3), FIG. 5 shows relationships between the 95% confidence intervals c (one side) and the numbers n of samples in the standard deviations $\sigma$ of the respective lots $L_j$ (j=1 to m). The examples shown in FIG. 5 show results of measurements performed mainly for critical dimensions (CD) of the respective patterns of the chip areas $Q_{11}$, $Q_{12}$, $Q_{13}$, $Q_{14}$ ... on the wafers 10a, 10b, 10c, 10d, 10e, 10f... by use of the scanning electron microscope as the testing device 1. It is assumed that the sampling of the wafers 10a, 10b, 10c, 10d, 10e, 10f... by the testing device 1 is performed without deviation and that the standard deviation $\sigma$ of each lot follows the normal distribution $N(\mu, \sigma^2)$. According to FIG. 5, it can be understood that an increase of the number n of samples to be tested by the testing device 1 makes it possible to control the 95% confidence interval c to be small irrespective of a magnitude of the standard deviation $\sigma$.

Furthermore, it is assumed that, with regard to the critical dimensions of the patterns of the chip areas $Q_{11}$, $Q_{12}$, $Q_{13}$, $Q_{14}$ ... tested by the testing device 1, the sample mean x is 130 nm, the standard deviation s is 14 nm, and the number n of samples is 30. When the above-described values are assigned to the Equation (3), the 95% confidence interval c obtained from the testing results becomes 5.0 nm as shown in FIG. 5. In this case, when the 95% confidence interval c is assigned to the Equation (4), the range where the population mean $\mu$ of the lot exists in the probability of 95% becomes 130±5 nm. Meanwhile, when Equation (3) is used in the case where, in regard to the critical dimensions, the standard deviation $\sigma$ is 14 nm, and the number n of samples is 50, the 95% confidence interval c becomes 3.9 nm. In this case, the range where the population mean $\mu$ of the lot exists in the probability of 95% becomes 130±3.8 nm. From the above results, it can be understood that, according to the sample investigation method using The Equations (2) and (3), the more the number n of samples is used, the smaller the 95% confidence interval c becomes, and the estimation accuracy of the confidence interval of the population mean $\mu$ can be controlled more accurately.

As understood from FIG. 5, the smaller the value of the standard deviation $\sigma$ becomes, the smaller the 95% confidence interval c becomes. From this, it is understood that, when the value of the standard deviation $\sigma$ is small, a certain level testing accuracy can be maintained without increasing the number n of samples as compared with the case where the value of the standard deviation $\sigma$ is large. For a ratio (reliability) at which the population mean $\mu$ exists, the 95% described above is suitable. However, it is satisfactory if the ratio is determined in accordance with accuracy required by a user.

The random number storage unit 33 stores a random number for arbitrary increasing the sampling number of the wafers 10a, 10b, 10c, 10d, 10e, 10f.... The analysis module 52 analyzes the statistical data and the confidence interval in the results of the tests performed by the testing device 1. The analysis module 52 includes a statistical data analysis unit 52a and a confidence interval analysis unit 52b. Based on the analysis information stored in the statistical data analysis information storage unit 32a, the statistical data analysis unit 52a analyzes the population mean $\mu$ and the sample standard deviation s of the lot $L_j$ from the product characteristics of the wafers 10a, 10b, 10c, 10e, 10f... tested by the testing device 1.

Based on the analytic equations (The Equations (2) or (3)) stored in the confidence interval analysis information storage unit 32b; the confidence interval analysis unit 52b analyzes the 95% confidence interval c of the population mean $\mu$ of the lot $L_j$ from the population mean $\mu$ and the sample standard deviation s, which are analyzed by the statistical data analysis unit 52a. The confidence interval comparison module 53 compares the 95% confidence interval tolerance $c_0$ stored in the confidence interval tolerance storage unit 31c with the 95% confidence interval c analyzed by the confidence interval analysis unit 52b. Here, "the 95% confidence interval tolerance $c_0$" refers to an upper limit of the range (95% confidence interval c) where the true value of the population mean $\mu$ of the lot exists in the probability of 95%.

Based on the random number stored in the random number storage unit 33 and the sampling number a stored in the sampling number storage unit 31a, the calculation module 54 randomly calculates the number of wafers 10a, 10b, 10c, 10d, 10e, 10f... sampled by the testing device 1. The sampling number comparison module 55 compares the sampling number a calculated by the calculation module 54 and a sampling number upper limit $a_{max}$ stored in the upper limit storage unit 31d. The warning module 56 warns that the testing should be stopped when the sampling number a calculated by the calculation module 54 is larger than the sampling number upper limit $a_{max}$ through the output device 9.

As the input device 7, a keyboard, a mouse or the like is usable. As the output device 9, a liquid crystal display (LCD), a light-emitting diode (LED) panel, an electro luminescence (EL) panel or the like is usable. The program storage device 11 stores a program for allowing the CPU 5 to control data transmission and reception between the devices connected to the CPU 5 and so on. The data storage device 13 temporarily stores data in a computation process of the CPU 5.

Figure 4:
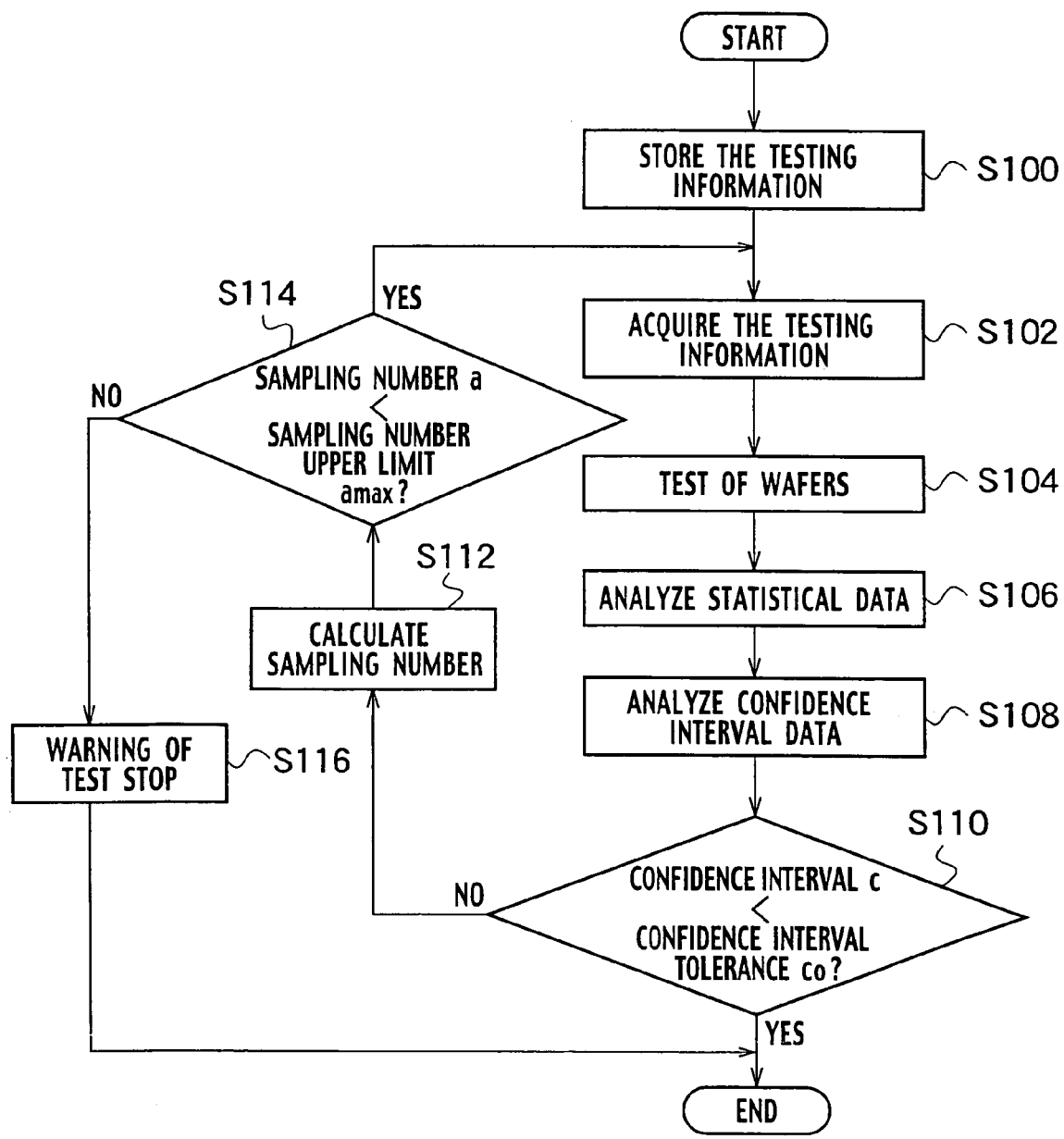
FIG. 4 is a flowchart showing an example of a computer implemented testing method according to the first embodiment of the present invention.

Next, a testing method using the testing system shown in FIG. 1 is described by use of a flowchart of FIG. 4.

(A) In a step S100, the sampling number a, the sampling order, the confidence interval tolerance $c_0$ and the sampling number upper limit $a_{max}$ for selectively sampling the wafers 10a, 10b, 10c, 10d, 10e, 10f... from the lot $L_j$ as shown in FIG. 2 are stored, through the input device 7 shown in FIG. 1, in the sampling number storage unit 31a, the sampling order storage unit 31b, the confidence interval tolerance storage unit 31c and the upper limit storage unit 31d, respectively. For example, with regard to the wafers 10a, 10b, 10c, 10d, 10e, 10f..., when the sampling number a is five, the confidence interval tolerance $c_0$ of the lot $L_j$ is 5 nm, the sampling number upper limit $a_{max}$ is twenty, and the sampling order is 10a, 10f, 10d, 10b, 10c, 10e... as shown in FIG. 2, these pieces of testing information are stored, through the input device 7, in the sampling number storage unit 31a, the sampling order storage unit 31b, the confidence interval tolerance storage unit 31c and the upper limit storage unit 31d, respectively. Though not illustrated, a number y of chip areas to be tested per each of wafers 10a, 10b, 10c, 10d, 10e, 10f... and a number n of samples (n=a×y) which is the total number of objects to be tested are also stored previously in the main storage device 3 through the input device 7.

(B) Statistical data analysis information for analyzing the statistical data and confidence interval analysis information for analyzing the 95% confidence interval c of the whole of the lot $L_j$ from the tested results are stored through the input device 7 into the statistical data analysis information storage unit 32a and the confidence interval analysis information storage unit 32b of the analysis information storage unit 32, respectively. For example, when the lot $L_j$ to be tested follows the normal distribution, analytic equations for analyzing the sample mean x and the sample standard deviation s of the tested results are stored in the statistical data analysis information storage unit 32a from the input device 7. Equations (2) and (3) for analyzing the 95% confidence interval c of the population mean µ of the lot $L_j$ are stored in the confidence interval analysis information storage unit 32b through the input device 7.

(C) In a step S102, the information acquisition module 51 acquires testing information such as the number n of samples, the sampling number a of the wafers, and the sampling order thereof, which are the test conditions of the testing device 1, from the sampling number storage unit 31a and the sampling order storage unit 31b. In a step S104, based on the test conditions acquired by the information acquisition module 51, the testing device 1 selectively samples the wafers 10a, 10b, 10c, 10d, 10e, 10f . . . in the lot $L_j$ as shown in FIG. 2, and tests the product characteristics. For example, when the sampling number a of the lot $L_j$ shown in FIG. 2 is set to be five and the sampling order is set as 10a, 10f, 10d, 10b, 10c, 10e, the testing device 1 first tests the product characteristics of the chip areas $Q_{11}$, $Q_{12}$, $Q_{13}$, $Q_{14}$ . . . formed on the wafer 10a shown in FIG. 2, and subsequently tests the wafers 10f, 10d, 10b and 10c in this order. Tested results thus obtained are stored in the data storage device 13.

(D) In a step S106, the statistical data analysis unit 52a of the analysis module 52 shown in FIG. 1 acquires the tested results of the testing device 1, and analyzes the sample mean x and the sample standard deviation s of the tested results based on the analytic equations and an analytic program, which are stored in the data analysis information storage unit 32a.

(E) In a step S108, the confidence interval analysis unit 52b analyzes the 95% confidence interval c of the whole of the lot $L_j$ shown in FIG. 2 from the sample mean x and the sample standard deviation s, which have been analyzed in the step S106, based on the Equation (2) or (3) stored in the confidence interval analysis information storage unit 32b. Here, when the standard deviation σ of the lot to be tested is already known before testing, the confidence interval analysis unit 52b performs analysis by use of Equation (3). Meanwhile, when it is impossible to determine the sample standard deviation σ of the whole of the lot before the testing, the confidence interval analysis unit 52b performs the analysis by use of the Equation (2).

(F) In a step S110, the confidence interval comparison module 53 compares the confidence interval c analyzed by the confidence interval analysis unit 52b with the confidence interval tolerance $c_0$ stored in the confidence interval tolerance storage unit 31c of the testing information storage unit 31. When the confidence interval c is lower than the confidence interval tolerance $c_0$, it is determined that the confidence interval c is estimated accurately, and testing by the testing device 1 is completed. Meanwhile, when the confidence interval c exceeds the confidence interval $c_0$, it is determined that the confidence interval c is not estimated accurately, and the method proceeds to a step S112.

(G) In the step S112, the calculation module 54 multiplies the random number equal to one or more, which is read from the random number storage unit 33, by the sampling number stored in the sampling number storage unit 31a, and increases the sampling number of wafers to be re-tested by the testing device 1 to more than the sampling number sampled in the step S104. The calculation method of the sampling number by the calculation module 54 is not limited to the method described above. For example, the calculation module 54 may increase the sampling number of wafers by increments of a constant number based on a value of a range of the number to be increased, which is pre-stored in the main storage device 3.

(H) In a step S114, the sampling number comparison module 55 compares the sampling number a increased by the calculation module 54 with the sampling number upper limit $a_{max}$ stored in the upper limit storage unit 31d of the testing information storage unit 31. When the sampling number a is smaller than the sampling number upper limit $a_{max}$, the method proceeds to the step S102, and in the step S104, re-testing by the testing device 1 is performed. Meanwhile, when the sampling number a is larger than the sampling number upper limit $a_{max}$, the method proceeds to a step S116. In the step S116, the warning module 56 allows the output device 7 to display a warning content to the effect that the testing by the testing device 1 should be stopped, and testing is completed.

In the computer implemented testing method according to the first embodiment of the present invention, the 95% confidence interval c of the lot that is the population is sequentially analyzed from statistical data. (sample mean x, sample standard deviation s) of the wafers selectively sampled and tested from the lot by the testing device 1. If the 95% confidence interval c is larger than the 95% confidence interval tolerance $c_0$, the sampling number a of the wafers to be tested by the testing device 1 is increased, the re-testing is performed, and thus the 95% confidence interval c is reanalyzed, and accordingly, the range of the confidence interval of each lot can be controlled to be a certain value or less. Therefore, the testing accuracy of a certain level or more can be always maintained irrespective of the variations (standard deviation σ) of the processes and the objects to be tested.

When trying to obtain high testing accuracy in the case where the standard deviation σ of the process or the testing device 1 itself is large, more tests will sometimes be required than usual. However, it is not realistic to sample and test too many wafers from viewpoints of a throughput and cost of the testing device 1. In the testing method according to the first embodiment, when the 95% confidence interval c does not become lower than the preset 95% confidence interval tolerance $c_0$ even if the 95% confidence interval c exceeds the sampling number tolerance $a_{max}$, the testing is stopped, and a warning about the stoppage situation is issued to the user through the output device 9. Accordingly, a testing failure of the testing device 1 or the manufacturing process can be detected early.

Figure 6:
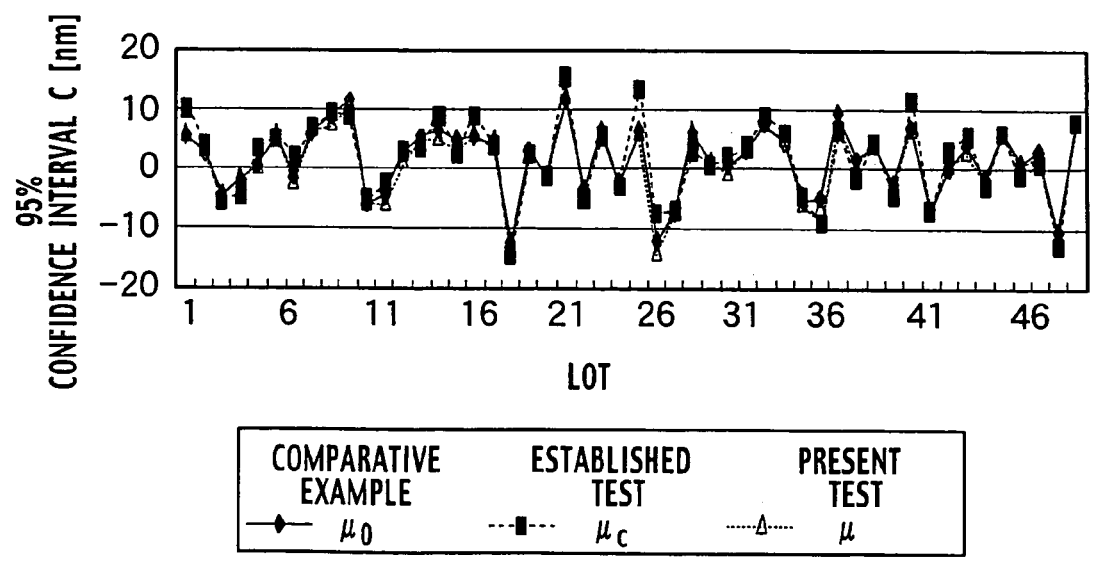
FIG. 6 shows an example of the simulation results of the 95% confidence intervals of the population means of the respective lots when testing is performed by the testing method according to the first embodiment of the present invention.
Figure 7:
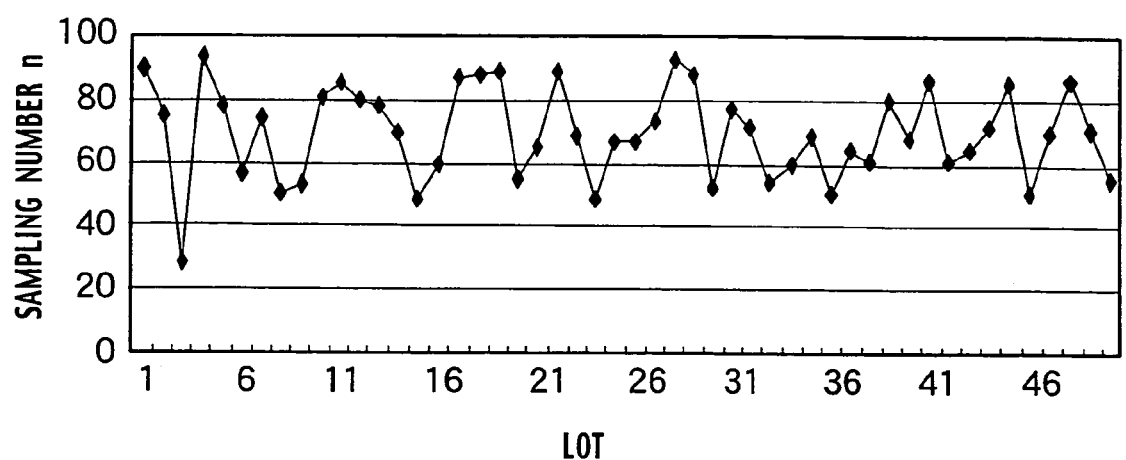
FIG. 7 shows an example of the simulation results of the transition of sampling numbers in the respective lots tested by the testing method according to the first embodiment of the present invention.
Figure 8:
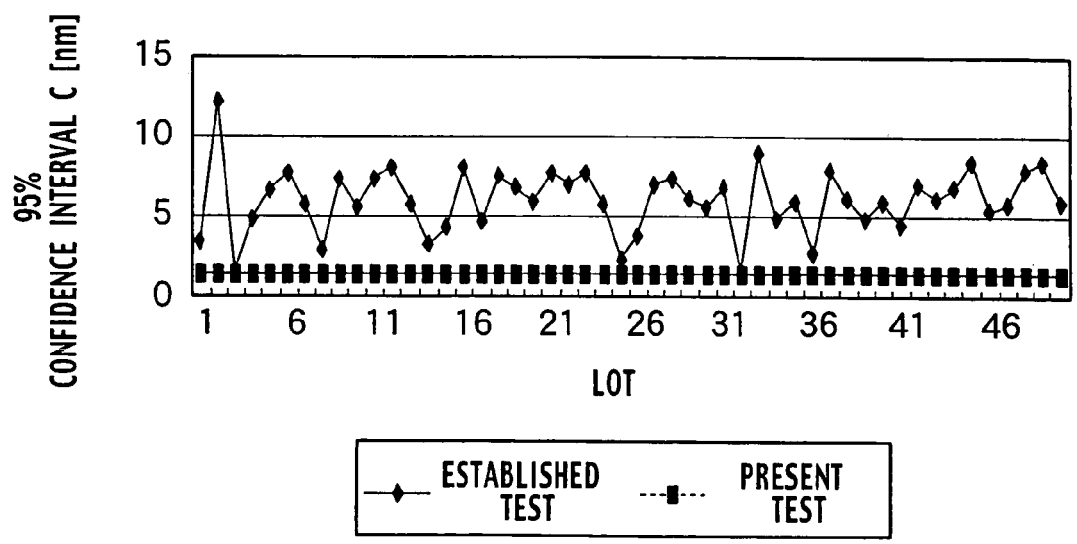
FIG. 8 shows an example of the simulation results of the transition of 95% confidence intervals of the population means of the respective lots according to the first embodiment of the present invention.

FIGS. 6 to 8 show a course of the sample means x of the respective lots and simulation results of the numbers n of samples when the testing is performed by use of the testing system shown in FIG. 1. In examples shown in FIGS. 6 to 8, one wafer includes 40 chip areas, and one lot $L_j$ is composed of 25 wafers. Results obtained by testing 50 lots $L_j$ (j=1 to m) in total (m=50) are shown. As a comparative example, a result is shown, which is obtained in a manner that critical dimensions (line widths) of patterns of total chip areas of one lot, that is, of patterns of 1000 (=40×25) chip areas were measured by the scanning electron microscope, and a mean value thereof was calculated as the population mean $\mu_0$. Furthermore, as a comparative example according to a conventional technology, a result is shown, which is obtained in a manner that five wafers were sampled from one lot, line widths of patterns of 10 chip areas from each wafer were measured, and a mean value $\mu_c$ was calculated.

In the testing method using the testing system shown in FIG. 1, as initial values of the testing information, for example, the sampling number a of the wafers was set at five, the confidence interval tolerance $c_0$ of the line widths of the patterns was set at 1.5 nm, and the sampling number upper limit $a_{max}$ was set at ten. Subsequently, the testing device 1 sampled five wafers from one lot based on the initial values of the testing information, and measured the line widths of the patterns of ten chip areas formed on each wafer by use of the scanning electron microscope. From measurement results, the sample mean x and the sample standard deviation s were calculated based on the statistical data. Note that it was previously confirmed that the standard deviation $\sigma$ in the lot was regarded as the normal distribution $N(\mu, \sigma^2)$. Subsequently, the 95% confidence interval c of the whole of the lot was analyzed by use of the Equation (2). Next, a value of the calculated 95% confidence interval c and a value of the pre-stored confidence interval tolerance ($c_0$=1.5) were compared in magnitude with each other. When the 95% confidence interval c was larger than the confidence interval tolerance $c_0$, it was determined that the estimation accuracy of the population mean $\mu$ was low, and then the number of samples was increased and re-tests were repeated. Then, at the time when the 95% confidence interval c became smaller than the confidence interval tolerance $c_0$, the measurement was completed. As understood from FIG. 6, the population mean $\mu$ obtained by the testing method according to the first embodiment nears the population mean $\mu_0$ in the case of performing the total test. Moreover, as understood from FIG. 7, though the numbers n of samples, which were measured from the respective lots by the testing device 1, differ for each lot, the numbers n of samples becomes greater than those in the conventional testing method. Furthermore, as understood from FIG. 8, the use of the testing method according to the first embodiment makes it possible to control the 95% confidence interval c of the population mean $\mu$ at a constant value of approximately 1.5 nm. Meanwhile, in the comparative example according to the conventional technology, the 95% confidence interval c of the mean value differs depending on each lot, and accordingly, the estimation accuracy cannot be maintained at constant level. From the above, it is understood that the testing can be always performed with high accuracy irrespective of the variations of the product characteristics of the objects to be tested in accordance with the testing method according to the first embodiment of the present invention.

Second Embodiment

Figure 9:
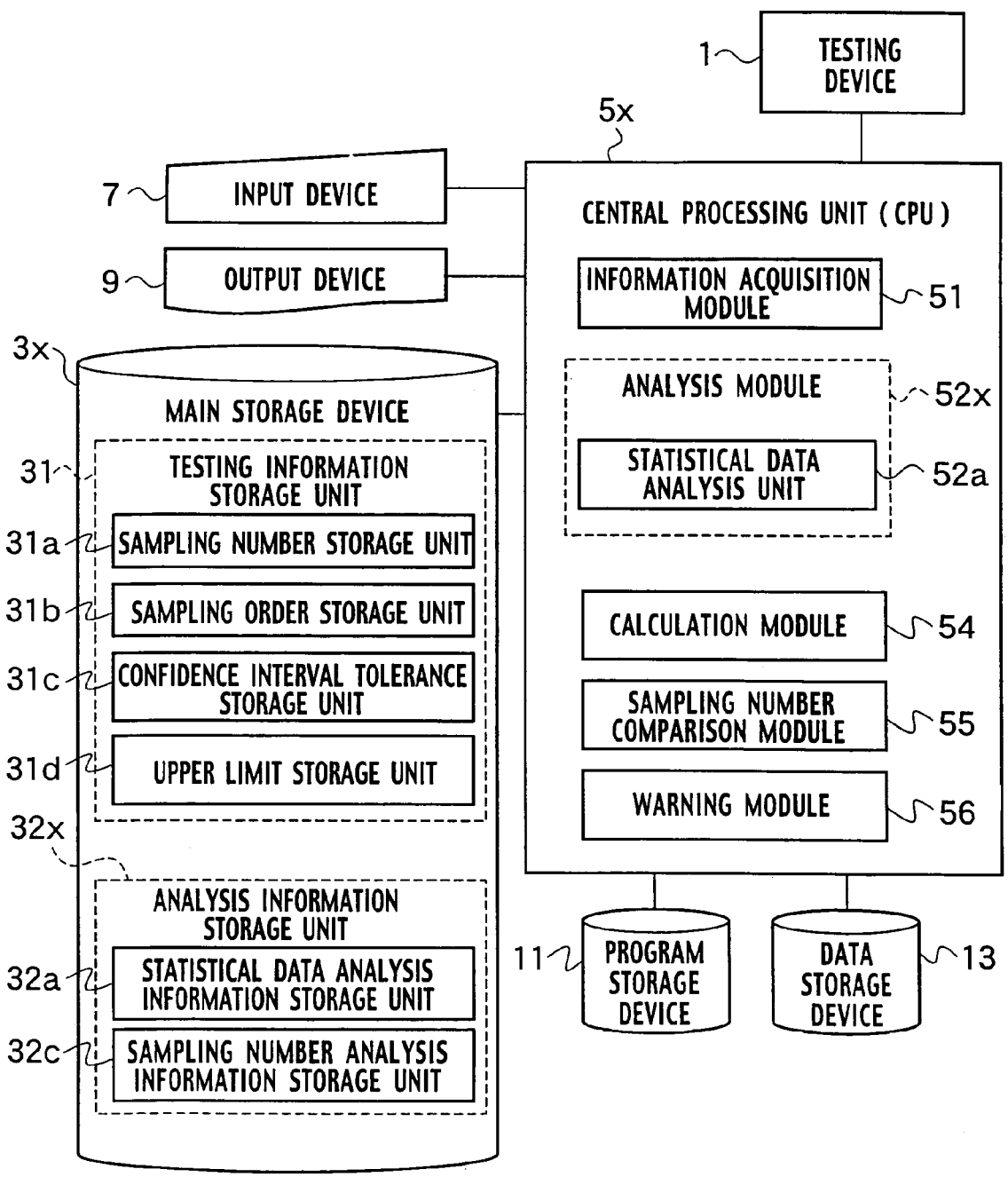
FIG. 9 is a block diagram showing a testing system according to the second embodiment of the present invention.

As shown in FIG. 9, a testing system according to a second embodiment of the present invention includes the testing device 1, a main storage device 3x, a central processing unit (CPU) 5x, the input device 7, the output device 9, the program storage device 11, and the data storage device 13. The main storage device 3 includes the testing information storage unit 31, and an analysis information storage unit 32x. The CPU 5x includes the information acquisition module 51, analysis module 52x, a calculation module 54x, a sampling number comparison module 55x, and a warning module 56x.

The analysis information storage unit 32x shown in FIG. 9 includes a sampling number analysis information storage unit 32c as well as the statistical data analysis information storage unit 32a. The sampling number analysis information storage unit 32c stores the following two equations. One is The Equation (5) for analyzing the number $n_k$ of samples (total number of chip areas to be measured) in a lot tested the k-th time by the testing device 1 based on the 95% confidence interval tolerance $c_0$ pre-stored in the testing information storage unit 31, which is represented as:

$$c_0 \geq ts_{k-1}/n_k^{1/2} \qquad (5)$$

An Equation (6) for analyzing a sampling number $a_k$ of wafers to be sampled from the k-th lot by the testing device 1, is represented as:

$$a_k = n_k/y \qquad (6)$$

Here, s denotes the sample standard deviation, and y denotes the number of chip areas measured per wafer. The calculation module 54x of the CPU 5x calculates the number $n_k$ of samples in the lot to be measured the k-th time and the sampling number $a_k$ of the wafers based on the analytic equations stored in the sampling number analysis information storage unit 32c. The sampling number comparison module 55x compares the sampling number $a_k$ calculated by the calculation module 54x with the sampling number upper limit $a_{max}$ stored in the upper limit storage unit 31d. The warning module 56x issues, through the output device 9, a warning to the effect that the testing work should be stopped when the sampling number $a_k$ is larger than the sampling number upper limit $a_{max}$. Other parts are the same as those in the testing system shown in FIG. 1, and description thereof is accordingly omitted.

Figure 10:
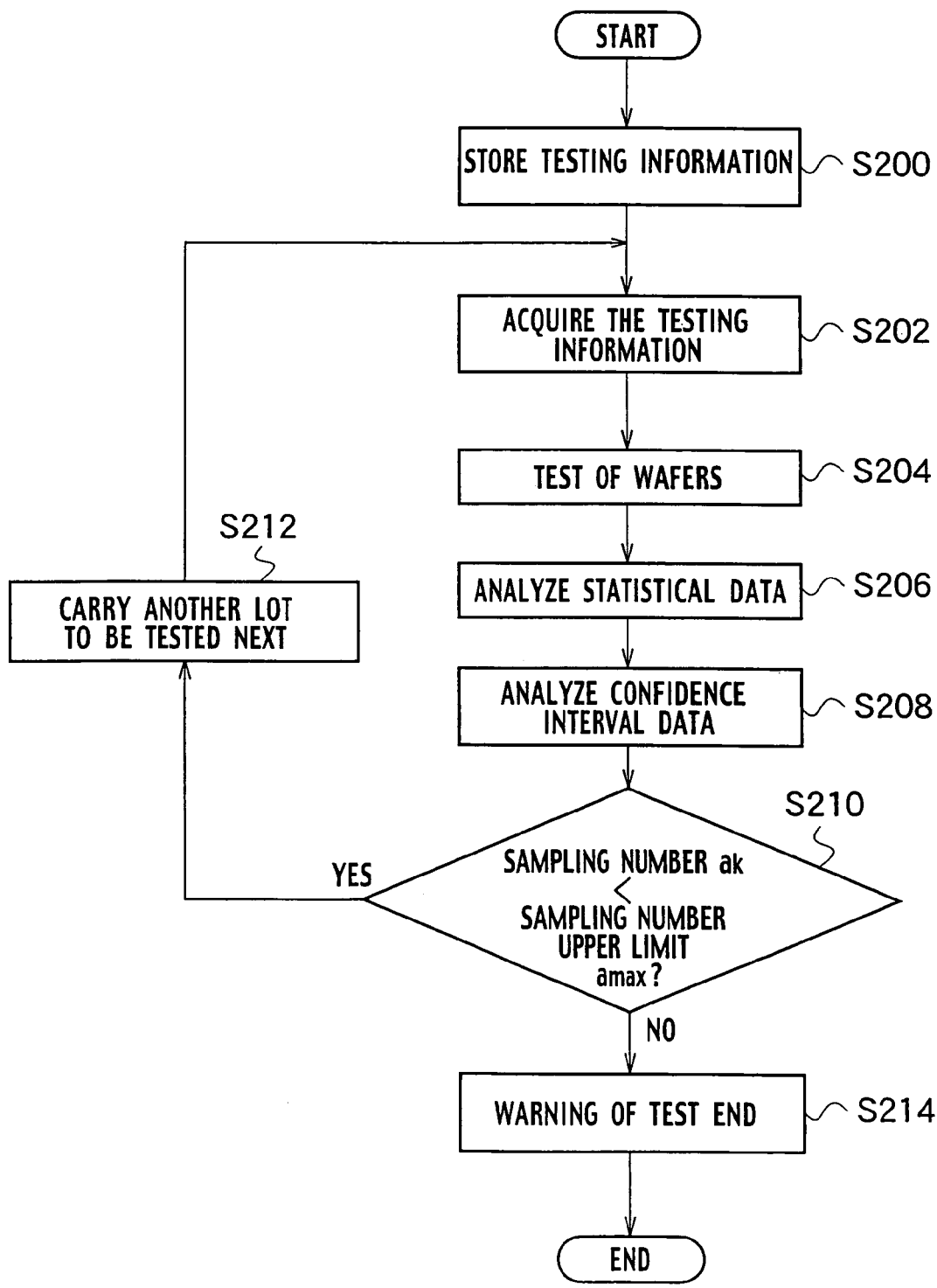
FIG. 10 is a flowchart showing a computer implemented testing method according to the second embodiment of the present invention.

Next, a testing method using the testing system shown in FIG. 9 is described by use of a flowchart of FIG. 10.

(A) In a step S200, the number a of wafers 10a, 10b, 10c, 10d, 10e, 10f . . . are selectively sampled from the lot $L_j$ shown in FIG. 2, and the testing information for measuring the product characteristics of the number $n_1$ of samples formed on the wafers 10a, 10b, 10c, 10d, 10e, 10f . . . is stored through the input device 7 in the testing information storage unit 31. Specifically, first, the sampling number $a_0$, sampling order, confidence interval tolerance $c_0$ and sampling number tolerance $a_{max}$ of the wafers, which are for measuring the total number (number of samples) $n_{max}$ of chip areas formed on the respective wafers in the first lot (k=1), are stored through the input device 7 in the sampling number storage unit 31a, sampling order storage unit 31b, confidence interval tolerance storage unit 31c and upper limit storage unit 31d of the main storage device 3, respectively.

(B) From the tested results obtained by the testing device 1, based on the statistical data analytic equation and the 95% confidence interval tolerance $c_0$ for analyzing the statistical data, an analytic equation for analyzing the number $n_k$ of samples of another lot to be tested next by the testing device 1 and an analytic equation for determining the sampling number $a_k$ of the wafers to be sampled from the other lot are stored through the input device 7 in the statistical data analysis information storage unit 32a and sampling number analysis information storage unit 32c of the analysis information storage unit 32x, respectively. For example, the analytic equation or the analytic program for analyzing the sample mean x and sample standard deviation s of the tested results obtained by the testing device 1 is stored from the input device 7 in the statistical data analysis information storage unit 32a. Furthermore, Equations (4) and (5) described above are stored through the input device 7 in the sampling number information storage unit 32c.

(C) In a step S202, the information acquisition module 51 shown in FIG. 9 acquires the testing information of the testing device 1 from the sampling number storage unit 31a and the sampling order storage unit 31b, respectively. Subsequently, in a step S204, based on test conditions acquired by the information acquisition module 51, the testing device 1 selectively samples and tests the wafers 10a, 10b, 10c, 10d, 10e, 10f . . . in the lot $L_j$ as shown in FIG. 2. For example, the testing device 1 measures product characteristics of the total number of chip areas of the first lot based on the sampling number $a_0$ of the wafers, which is stored in the sampling number storage unit 31a, and the number $n_{max}$ of samples in the lot.

(D) In a step S206, the statistical data analysis unit 52a shown in FIG. 9 analyzes the sample mean x and sample standard deviation s of the tested results outputted by the testing device 1 by use of the analytic equation or analytic program stored in the statistical data analysis information storage unit 32a. Subsequently, in a step S208, the calculation module 54x calculates the number $n_k$ of samples and the sampling number $a_k$ of the wafers based on Equations (5) and (6) stored in the sampling number analysis information storage unit 32c and the confidence interval tolerance $c_0$ stored in the confidence interval tolerance storage unit 31c. The sampling number $a_k$ of the wafers is stored in the sampling number storage unit 31a of the testing information storage unit 31.

(E) In a step S210, the sampling number comparison module 55x compares the sampling number $a_k$ calculated by the calculation module 54x with the sampling number upper limit $a_{max}$ stored in the upper limit storage unit 31d of the testing information storage unit 31. When the sampled sampling number $a_k$ becomes lower than the sampling number upper limit $a_{max}$, it is determined that the 95% confidence interval c of the population mean μ of the lot is controlled to be in a certain range or less, and the method proceeds to a step S212. Subsequently, in the step S212, the testing device 1 carries another lot to be tested next therein. In such a manner, the steps S202 to S210 are repeated. Meanwhile, when the sampling number $a_k$ calculated by the calculation module 54x exceeds the sampling number upper limit $a_{max}$, the method proceeds to a step S214, where the warning module 56x allows the output device 9 to display a message to the effect that the work should be stopped, and the testing is completed.

Figure 11:
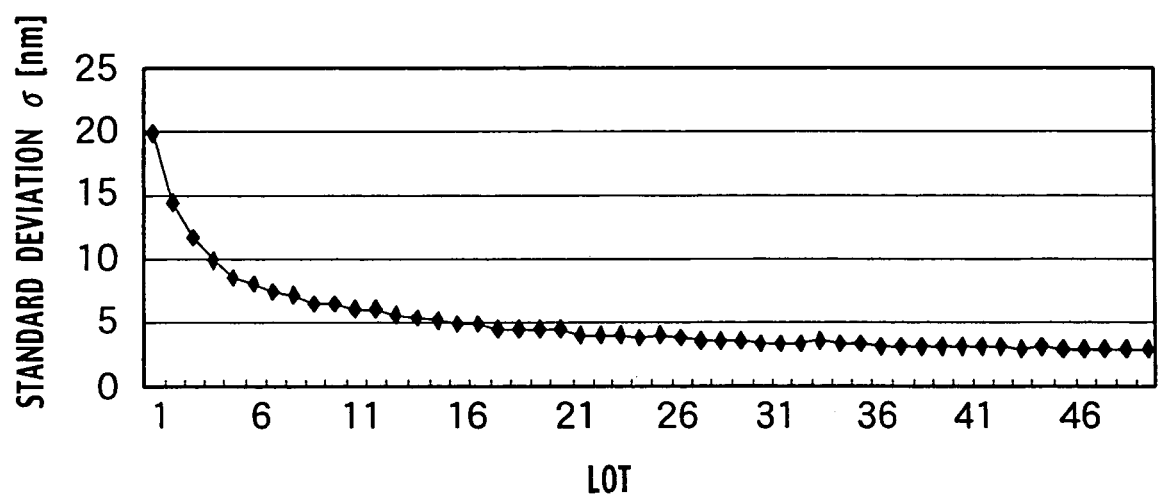
FIG. 11 shows an example of the simulation results of the transition of the standard deviations of the lots when all of the chip areas formed on the lots are tested.

FIG. 11 shows a state of variations of the standard deviation σ among the lots when the chip areas formed in the respective lots are all measured. As shown in FIG. 11, with regard to the standard deviations of the respective lots, values of those of lots introduced initially into the testing device 1 are large, and values of those of lots introduced later therein are small. As just described, in the manufacturing process of the semiconductor device, generally, the value of the standard deviation σ of the objects to be tested becomes smaller as the process progresses. What can be understood from the above is as follows. The sampling number $a_k$ or number $n_k$ of samples of the wafers is set large at the time of initiating the process when the value of the standard deviation σ is large, and the sampling number $a_k$ or number $n_k$ of samples of the wafers is set smaller as the process becomes mature, thus making it possible to perform the testing rapidly in a state where the constant testing accuracy is maintained. In the computer implemented testing system according to the second embodiment of the present invention, the sampling number $a_k$ or the number $n_k$ of samples of the other lot to be tested next by the testing device 1 is determined based on the statistical data of the lot measured in the past. Therefore, it is possible to select the sampling number $a_k$ or the number $n_k$ of samples in accordance with a maturity index of the process in a state where the measurement accuracy of the population mean μ is maintained, leading to achievement of rapid testing work. Moreover, when trying to obtain the high testing accuracy in a case where the standard deviation σ of the process or the testing device 1 itself is too large, more tests than usual are required. However, it is not realistic to sample and test too many wafers from viewpoints of the throughput and cost of the testing device 1. In the testing method according to the second embodiment, when the 95% confidence interval c does not become lower than the preset value even if the 95% confidence interval c exceeds the sampling number tolerance $a_{max}$, the testing is stopped, and warning of the stoppage situation is issued to the user through the output device 9. Accordingly, a testing failure due to a trouble of the testing device 1 or the process can be detected early.

Figure 12:
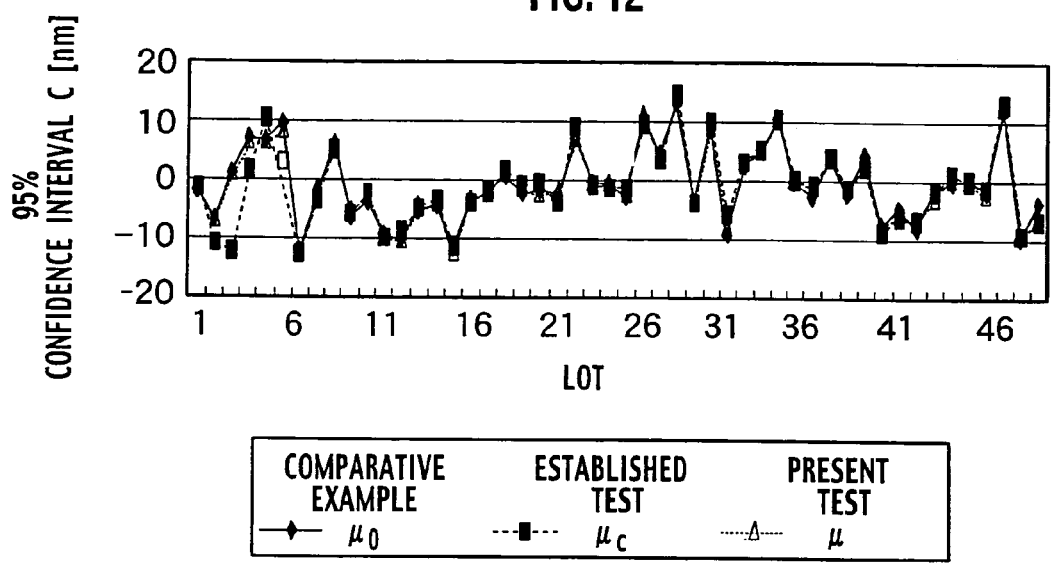
FIG. 12 shows an example of the simulation results of the transition of the 95% confidence intervals of the population means of the lots when testing is performed by the testing method according to the second embodiment of the present invention.
Figure 13:
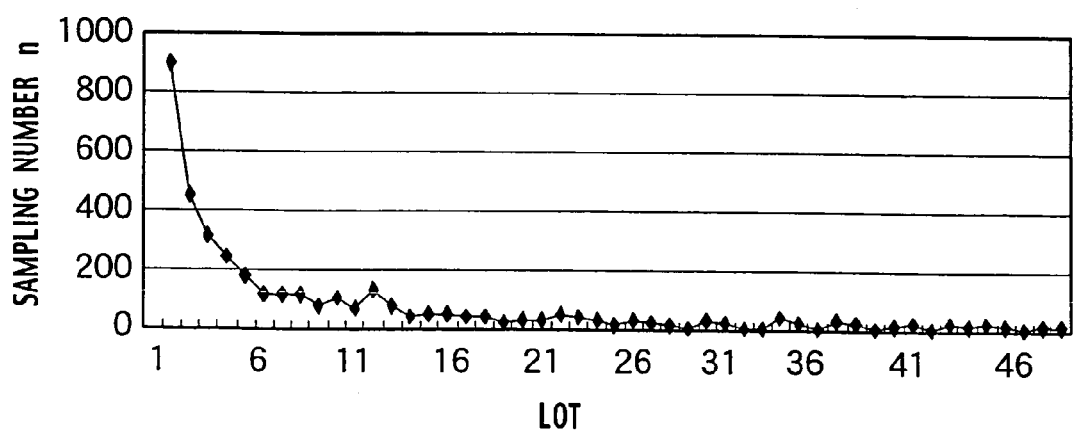
FIG. 13 shows an example of the simulation results of the transition of the sampling numbers in the lots according to the second embodiment of the present invention.

FIGS. 12 and 13 show a course of the mean values of the respective lots and simulation results of the sampling numbers of the wafers when the tests are performed by use of the testing system shown in FIG. 9. In examples shown in FIGS. 12 and 13, one wafer includes 40 chip areas, and one lot $L_j$ is composed of 25 wafers. Results obtained by testing 50 lots $L_j$ (j=1 to m) in total (m=50) are shown. As a comparative example, a result is shown, which is obtained in a manner that pattern line widths of total chip areas of one lot, that is, of 1000 (=40×25) chip areas were measured by a scanning electron microscope, and a mean value thereof was calculated as the population mean $μ_0$. Furthermore, as a comparative example according to the conventional technology, a result is shown, which is obtained in a manner that five wafers were sampled from one lot, pattern line widths of ten chip areas from each wafer were measured, and a mean value $μ_c$ was calculated. As understood from FIG. 12, the population mean μ obtained by the testing method according to the second embodiment nears the population mean $μ_0$ of the case of performing the total testing. Moreover, as understood from FIG. 13, the numbers $n_k$ of samples, which were measured from the respective lots, are large at the initial period when the variations of the data are large, and become small at the later period when the process becomes mature.

Method of Manufacturing Electronic Device

Next, a method of manufacturing an electronic device according to the embodiment of the present invention is described with reference to FIGS. 14 and 15. Note that, while the following manufacturing method of an electronic device is described by taking a semiconductor integrated circuit of a CMOS structure as an example, it is a matter of course that the manufacturing method can be applied to manufacturing methods of many electronic devices besides that of the semiconductor integrated circuit.

Figure 14:
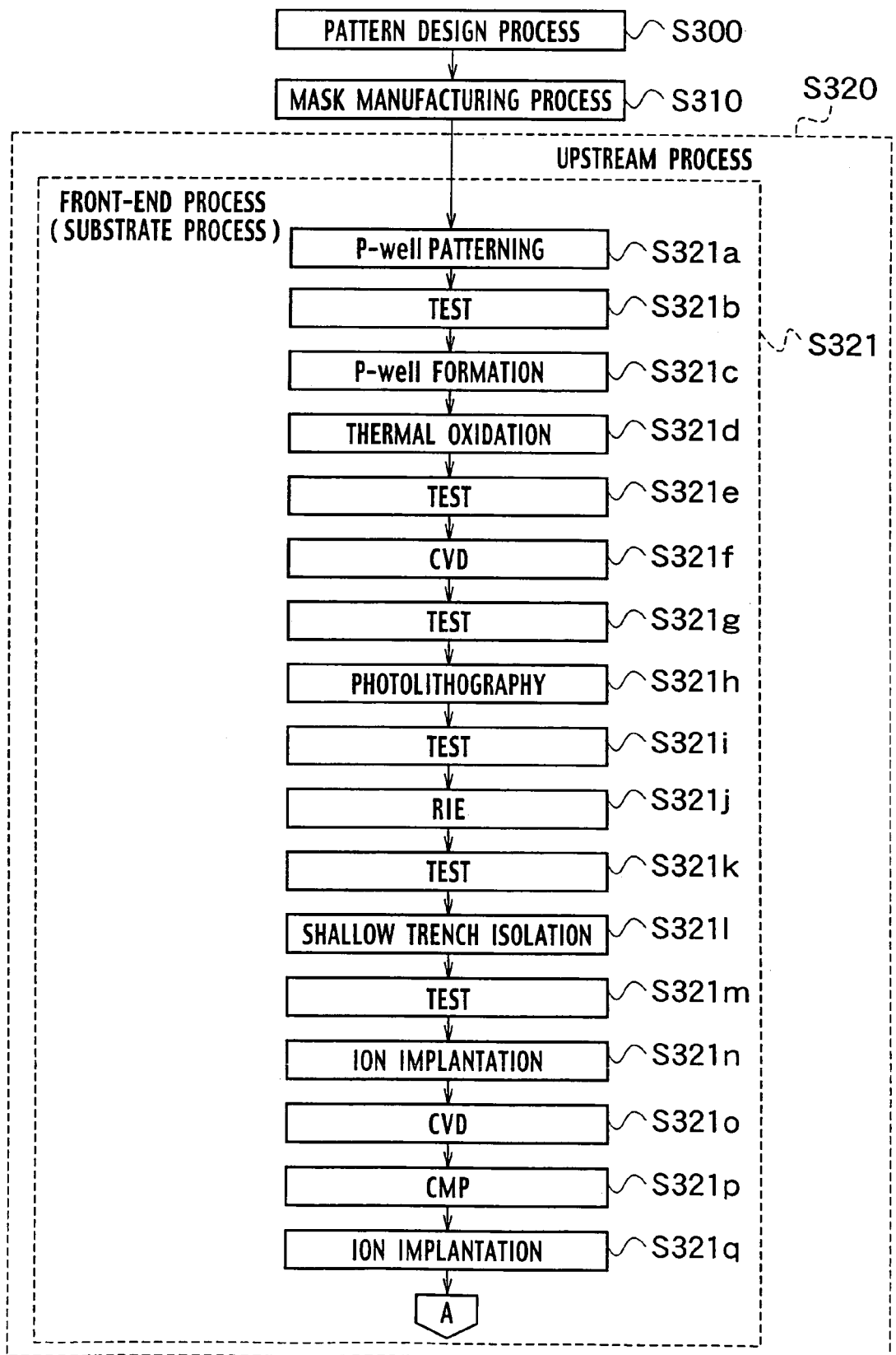
FIGS. 14 and 15 are flowcharts showing a method of manufacturing electronic devices according to the embodiment of the present invention.
Figure 15:
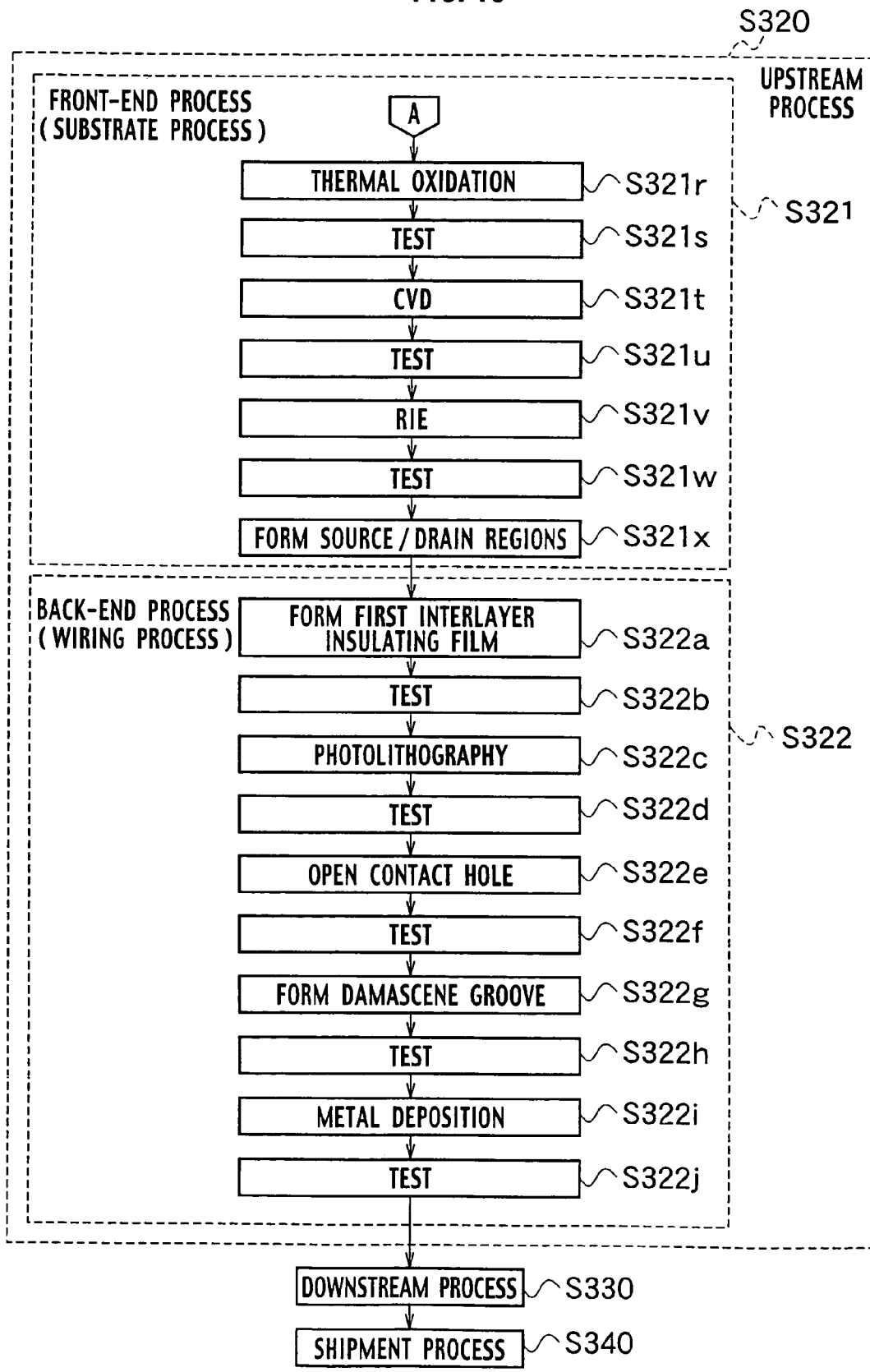

As shown in FIG. 14, the manufacturing method of electronic devices according to the embodiment of the present invention includes a pattern design process of a step S300, a mask manufacturing process of a step S310, an upstream process of step a S320, and a downstream process of a step S330. Thereafter, the electronic device is flown to a shipment process of a step S340. Usually, up to the mask manufacturing process of the step S310 is a preparation stage. Thereafter, a fabricating and testing processes composed of a pair of a series of the fabricating processes and in-line testing processes, which tests results of the fabricating processes as shown in the steps S320 to S330, are sequentially and repeatedly implemented plural times.

The above-mentioned testing system and computer implemented testing method can be performed as the in-line tests concerned as appropriate. For example, in the above, the in-line tests for sheet resistance ρ after ion implantation and the like and tests for film thickness of each thin film and the like are also included. Here, an example is shown, where the above-mentioned testing method is applied to a testing for a shape and dimension of a planar pattern, that is, a testing process after patterning regions where p-wells are formed, a testing process after patterning areas where elements are formed and isolated, and a testing process after patterning wiring.

(A) In the step S300, mask data of a CAD system is created based on various simulation results such as a process simulation. Then, in the step S310, by use of a pattern generator such as an electron beam exposure device, a set of a necessary number of masks (reticles) having a predetermined line width and pattern shape is manufactured so that the masks can have predetermined alignment allowances to one another.

(B) A silicon wafer is prepared. After a thermal oxidation film ($SiO_2$) is formed on a main surface of the silicon wafer, in a step S321a, a photoresist film is coated and delineated by a photolithography technology, and the p-well areas are opened. In a step S321b, for example, in accordance with the flowchart shown in FIG. 4, the testing device 1 shown in FIG. 1 selectively samples the wafers to serve as samples to be tested from the respective lots, and tests the pattern dimensions of the p-well formed regions formed on the wafer. In the step S106, the analysis module 52 of FIG. 1 analyzes statistical data of pattern dimensions. Furthermore, in the step S108, the analysis module 52 analyzes the 95% confidence interval c of the population mean μ of the pattern dimensions obtained from analyzed statistical data. In the step S110, when the analyzed 95% confidence interval c becomes lower than the confidence interval tolerance $c_0$ pre-stored in the main storage device 3, the testing for the lot is completed, and the next lot is tested. Meanwhile, when the analyzed 95% confidence interval c exceeds the confidence interval tolerance $c_0$, the calculation module 54 shown in FIG. 1 increases the sampling number of wafers to be tested by the testing device 1 in the step S112. Here, in the step S114, when the sampling number calculated by the calculation module 54 is smaller than the sampling number upper limit pre-stored in the main storage device 3, the tested lot is re-tested. Meanwhile, when the sampling number calculated by the calculation module 54 is larger than the sampling number upper limit pre-stored in the main storage device 3, in the step S116, the warning module 56 allows the output device 7 to display the message to the effect that the testing should be stopped, and allows the manufacturing process to be stopped. When the lot passes the testing of the step S321b, the process proceeds to a step S321c shown in FIG. 14.

(C) In the step S321c, boron ions are implanted into the p-well formed regions through the thermal oxidation film. Next, the photoresist film is removed, and a predetermined cleaning process is completed, and then the implanted boron ions are thermally treated (thermally diffused), thus forming the p-wells. Next, the thermal oxidation film on the main surface of the wafer is entirely removed (peeled off), and then in a step S321d, another thermal oxidation film is formed on the main surface of the wafer. In a step S321e, the testing device 1 tests film thickness of a thermal oxidation film formed on the wafer. This film thickness testing corresponds to the step S104 of FIG. 4. In the step S104, the testing device 1 selectively samples wafers to serve as samples to be tested from the respective lots, and tests the thickness of the thermal oxidation films formed on the wafers. Then, in the step S106, the analysis module 52 of FIG. 1 analyzes the statistical data of the thickness of the tested thermal oxidation films. In the step S108, the analysis module 52 analyzes the 95% confidence interval c of the population mean μ from the statistical data of the film thickness. Thereafter, in the step S110, when the analyzed 95% confidence interval c becomes lower than the confidence interval tolerance $c_0$ pre-stored in the main storage device 3, the test for the lot is completed, and the next lot is tested. Meanwhile, when the analyzed 95% confidence interval c exceeds the confidence interval tolerance $c_0$, the sampling number of wafers to be tested is increased, and re-testing is performed. When the lot passes the testing of the step S321e, the process proceeds to a step S321f.

(D) In The step S321f, a nitride film is grown on a surface of the thermal oxidation film by CVD. Next, in a step S321g, thickness of the nitride film formed on each wafer is tested according to the flowchart shown in FIG. 4. Because the testing in the step S321g is similar to that in the step S321e, duplicate description is omitted. When the lot passes the testing of the step S321g, the process proceeds to a step S321h. In the step S321h, a photoresist film delineated by photolithography technology is formed on the nitride film. In a step S321i, the testing device 1 selectively samples the wafers from the lots, and tests a pattern shape and dimension of the photoresist film formed on each wafer in accordance with the flowchart shown in FIG. 4. Because the testing in the step S321i is similar to that in the step S321b, duplicate description is omitted. When the lot passes the testing of the step S321i, the process proceeds to a step S321j.

(E) In the step S321j, reactive ion etching (RIE) is performed by using the photoresist mask formed on the wafer as a mask, and the nitride film on the regions where the elements are formed and isolated is removed. In a step S321k, the testing device 1 selectively samples wafers from the lot, and tests a pattern shape and dimension formed on the wafer after the RIE in accordance with the flowchart shown in FIG. 4. In a step S321l, the main surface of the wafer is partially etched, and element isolation trenches are formed. In this step, the regions where the elements are formed and the regions where the elements are isolated are partitioned from each other. At this point, the regions where the elements are formed are coated with the nitride film. Thereafter, the photoresist film for use in the patterning of the nitride film is removed. In a step S321m, the testing device 1 selectively samples the wafers from the lot, and tests a pattern shape and dimension of the regions where the elements are isolated and formed, the regions being formed on the wafers, in accordance with the flowchart shown in FIG. 4.

(F) In a step S321n, ions of impurities preventing inversion layers are implanted into bottoms of the element isolation trenches, and in a step S321o, an oxidation film is buried in the element isolation trenches by use of the CVD. Subsequently, in a step S321p, chemical mechanical polishing using the nitride film as a stopper planarizes the main surface of each wafer, and the nitride film is removed, a dummy oxidation film is formed on the element-formed regions. In a step S321q, ion implantation for controlling a gate threshold voltage ($V_{th}$ control) is performed. The dummy oxidation film used as a protection film when the ions for the $V_{th}$ control are implanted is peeled off, and in a step S321r of FIG. 15, thermal oxidation is performed to form a gate oxidation film. In a step S321s, the testing device 1 selectively samples the wafers from the lot, and tests a pattern shape and dimension of the gate oxidation film formed on each wafer in accordance with the flowchart shown in FIG. 4.

(G) In a step S321*t*, a polysilicon film is deposited on the gate oxidation film by use of a CVD furnace, and a photoresist film delineated by the photolithography technology is formed on the polysilicon film. In a step S321*u*, the testing device 1 selectively samples wafers from the lot, and tests an overlay error and dimension of the pattern shape of the photoresist film formed on each wafer in accordance with the flowchart shown in FIG. 4. In a step S321*v*, gate electrodes and polysilicon wiring are etched by the RIE by using this photoresist film as a mask. Thereafter, the photoresist film is removed. In a step S321*w*, a dimension and overlay error of the pattern of the gate electrodes and polysilicon wiring are tested by the testing device 1. In a step S321*x*, source/drain regions are formed on the wafer by the photolithography technology.

(H) In a step S322*a*, insulating first metal wiring interconnecting transistors and a polysilicon film in which the gate electrodes are formed, a first interlayer insulating film is deposited by the CVD. Next, in a step S322*b*, thickness of the first interlayer insulating film is tested in accordance with the flowchart shown in FIG. 4. In a step S322*c*, a photoresist film patterned by means of the photolithography technology is formed on the first interlayer insulating film. In a step S322*d*, thickness of the photoresist film is tested in accordance with the flowchart shown in FIG. 4. In a step S322*e*, RIE is performed using the photoresist film as a mask, and contact holes reaching the source/drain regions are opened in this first interlayer insulating film. In a step S322*f*, a dimension of the contact holes is tested in accordance with the flowchart shown in FIG. 4.

(I) In a similar way to the above, formation of damascene grooves in a step S322*g*, testing in a step S322*h*, metal deposition in a step S322*i* and testing in a step S322*j* are performed. A surface of the first interlayer insulating film is planarized by CMP, and Cu is buried in the contact holes and the trenches, and thereon, a second interlayer insulating film is deposited by CVD. In such a manner, multi-layer wiring is sequentially formed. Note that, on the uppermost layer, a passivation film with a thickness of approximately 1 µm for the purpose of preventing a mechanical damage and preventing invasion of moisture and impurities is deposited on the uppermost metal wiring by CVD. For the passivation film, a PSG film, a nitride film and the like are utilized.

(J) When the multi-layer wiring structure and the tests are completed, the wafer is divided into chips with a predetermined size in the step S330. Then, each chip is mounted on a packaging material, and electrode pads on the chip and lead of a lead frame are connected to each other. Thereafter, a package is assembled, followed by a characteristic test regarding the manufacturing/function of the semiconductor device and the like, and the electronic device is thus completed. In the step S340, the electronic device having passed all of the processes described above is packaged for protection from moisture, static electricity and the like, and shipped as a product.

In the method of manufacturing an electronic device according to the embodiment of the present invention, tests can always be performed with high accuracy irrespective of the variations of the product characteristics after each of the manufacturing steps.

Other Embodiments

Various modifications will become possible for those skilled in the art after receiving the teachings of the present disclosure without departing from the scope thereof.

For example, though the testing system and computer implemented testing method, which can test wafers of semiconductor devices have been described in the above embodiments of the present invention, the present invention is not limited for use in the semiconductor devices. It is a matter of course that the present invention is applicable to manufacturing processes of other industrial products in which samples are partially sampled from a population, as in manufacturing processes of a liquid crystal device, a magnetic recording medium, an optical recording medium, a thin-film magnetic head, and a super-conducting element. For example, the manufacturing process of the thin-film magnetic head is composed of a repetition of a CVD process, a photolithography process, an etching process and the like, which are similar to those in manufacturing the semiconductor integrated circuit though the number of processes is small. Therefore, it is readily understood that the testing method of the present invention is applicable to the manufacturing process of the thin-film magnetic head.

What is claimed is:

1. A method for manufacturing electronic devices comprising:
    a plurality of fabrication processes of the electronic devices;
    a plurality of in-line testing processes of the corresponding fabrication processes, each of the in-line testing processes comprising:
        storing testing information and analysis information in a main storage device;
        sampling one of the electronic devices as a first sample from a lot of the electronic devices, which have been treated though the corresponding one of the fabrication processes;
        testing product characteristics of the first sample by sampling the first sample from a population;
        analyzing at least one of statistical data included in the tested results and a confidence interval of a mean value of the population, based on the analysis information;
        calculating a first sampling number of the first sample, based on results of analyzing; and
        calculating a second sampling number of a second sample scheduled to be tested next to the first sample based on statistical data included in the tested results and confidence interval tolerance of the first sample.

2. A method for manufacturing electronic devices comprising:
    a plurality of fabrication processes of the electronic devices;
    a plurality of in-line testing processes of the corresponding fabrication processes, each of the in-line testing processes comprising:
        storing testing information and analysis information in a main storage device;
        sampling one of the electronic devices as a first sample from a lot of the electronic devices, which have been treated though the corresponding one of the fabrication processes;
        testing product characteristics of the first sample by sampling the first sample from a population;
        analyzing at least one of statistical data included in the tested results and a confidence interval of a mean value of the population, based on the analysis information;
        calculating a first sampling number of the first sample, based on results of analyzing;
        storing a sampling number upper limit of the first sample in the main storage device;

comparing the first sampling number with the sampling number upper limit;

warning a stoppage of the testing based on a compared result of comparing; and displaying the stoppage of the testing.

3. A method for manufacturing electronic devices comprising:

a plurality of fabrication processes of the electronic devices;

a plurality of in-line testing processes of the corresponding fabrication processes, each of the in-line testing processes comprising:

storing testing information and analysis information in a main storage device;

sampling one of the electronic devices as a first sample from a lot of the electronic devices, which have been treated though the corresponding one of the fabrication processes;

testing product characteristics of the first sample by sampling the first sample from a population;

analyzing at least one of statistical data included in the tested results and a confidence interval of a mean value of the population, based on the analysis information; and calculating a first sampling number of the first sample, based on results of analyzing;

wherein the in-line testing processes include testing of an overlay error between patterns in a chip area delineated on a wafer.

4. A method for manufacturing electronic devices comprising:

a plurality of fabrication processes of the electronic devices;

a plurality of in-line testing processes of the corresponding fabrication processes, each of the in-line testing processes comprising:

storing testing information and analysis information in a main storage device;

sampling one of the electronic devices as a first sample from a lot of the electronic devices, which have been treated though the corresponding one of the fabrication processes;

testing product characteristics of the first sample by sampling the first sample from a population;

analyzing at least one of statistical data included in the tested results and a confidence interval of a mean value of the population, based on the analysis information; and calculating a first sampling number of the first sample, based on results of analyzing;

wherein the in-line testing processes include testing of a dimension of a pattern in a chip area delineated on a wafer.

* * * * *